United States Patent [19]

Jung et al.

[11] Patent Number: 5,402,086

[45] Date of Patent: Mar. 28, 1995

[54] SIGNAL NOISE REDUCTION SYSTEM

[75] Inventors: Duckyoung Jung, Incheon; Seungyup Koo, Seoul, both of Rep. of Korea

[73] Assignee: Samsung Electronics Co., Ltd., Kyungki-do, Rep. of Korea

[21] Appl. No.: 172,217

[22] Filed: Dec. 23, 1993

[30] Foreign Application Priority Data

Dec. 23, 1992 [KR] Rep. of Korea ............... 92-25315

[51] Int. Cl.⁶ .............................................. H03F 1/26
[52] U.S. Cl. .................................... 330/149; 330/151
[58] Field of Search ............... 330/149, 151; 333/14; 381/106; 455/72

[56] References Cited

U.S. PATENT DOCUMENTS

| | | |
|---|---|---|
| 3,631,365 | 12/1971 | Dolby . |
| 4,547,741 | 10/1985 | Katakura . |
| 5,159,284 | 10/1992 | Jung et al. ............... 330/149 |

FOREIGN PATENT DOCUMENTS

| | | | |
|---|---|---|---|
| 182613 | 10/1984 | Japan | ............... 333/14 |
| 931565 | 1/1993 | Rep. of Korea . | |

*Primary Examiner*—James B. Mullins
*Attorney, Agent, or Firm*—Stephen R. Whitt; Robert A. Westerlund; Charles R. Donohoe

[57] ABSTRACT

A signal noise reduction system including a main signal path which conducts a first signal, and an auxiliary signal path which conducts a second signal, the system comprising; a high-pass filter in the auxiliary signal path receiving second signal at an input terminal, a voltage-to-current converter, connected to the high-pass filter, an amplifier, connected to the voltage-to current converter, and an adder for combining the signals on the two signal paths to produce an output signal at an output terminal.

13 Claims, 5 Drawing Sheets

FIG. 1 (Prior Art 1)
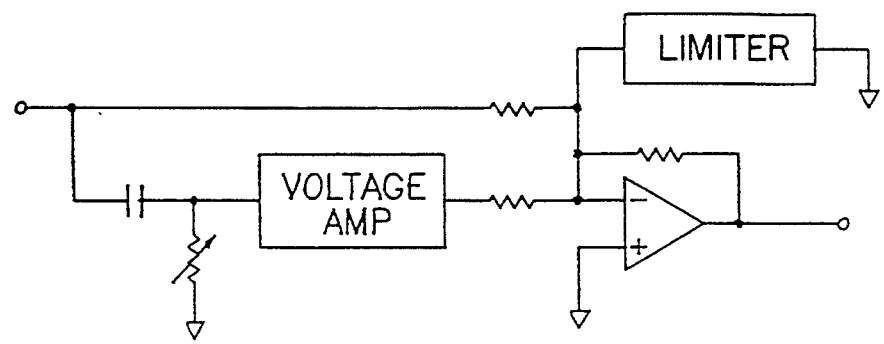
FIG. 2 (Prior art)
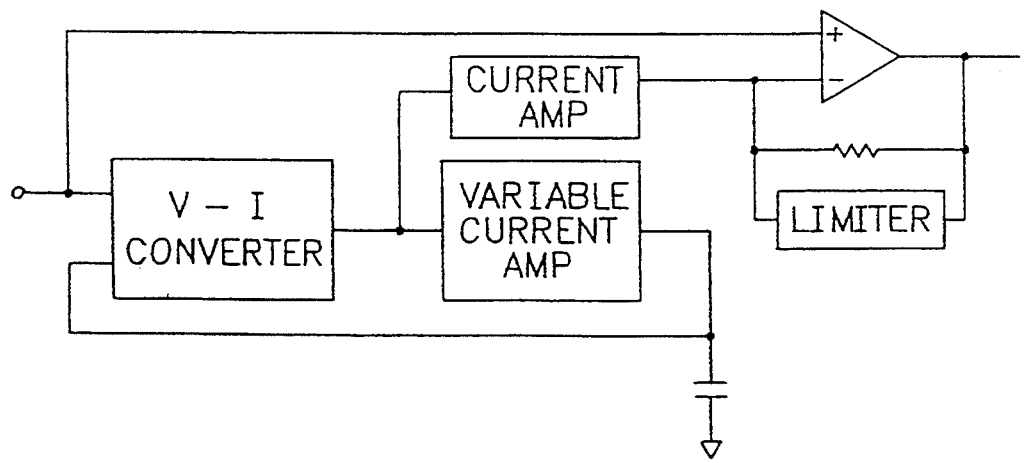

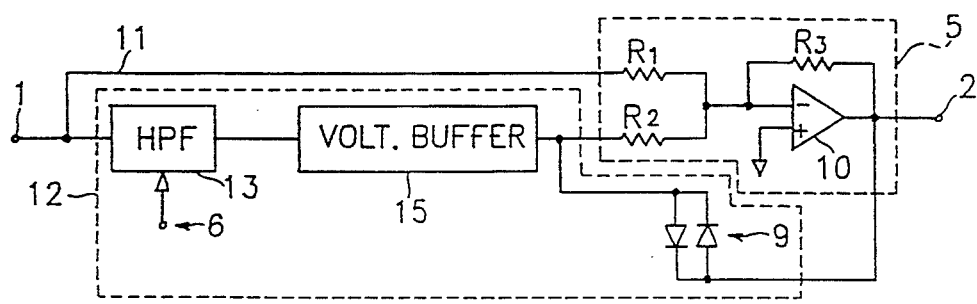
FIG.3(Prior Art 3)
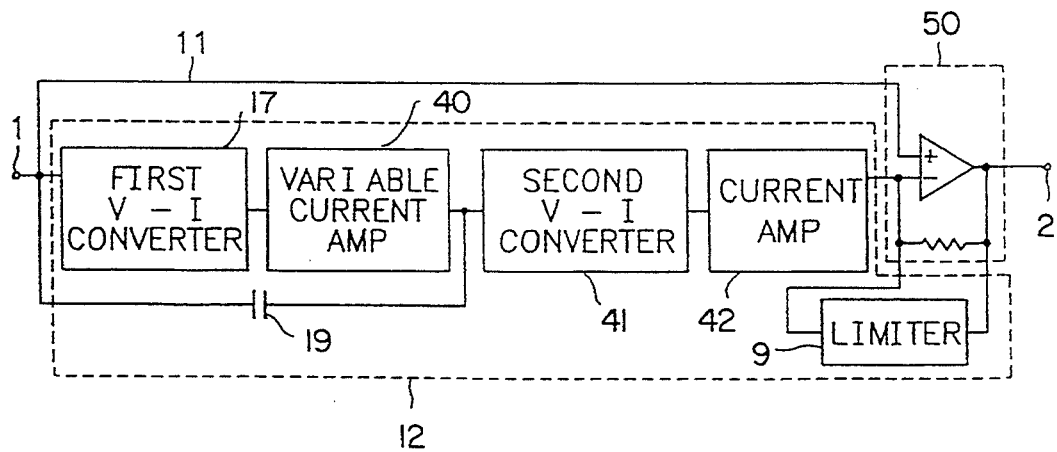
FIG.4

SIGNAL NOISE REDUCTION SYSTEM

BACKGROUND OF THE INVENTION

The present invention relates to a signal noise reduction system, and in particular to a noise reduction system having a main signal path and an auxiliary signal path.

Noise reduction systems have been developed since, at least, the 1960's. Exemplary of these early systems is one developed by Dolby Laboratories in England which was the subject of U.S. Pat. No. 3,361,365. These early systems first incorporated the principles of signal compression and expansion to cancel noise in an input signal. Many conventional noise reduction systems can be characterized by the simple circuit shown in FIG. 1, In this circuit, an input signal including noise is fed through a main signal path and through an auxiliary signal path. The respective outputs of these two paths are summed, or added, in an adding unit which produces a compressed signal output. The compressed signal may subsequently be stored by well-known storage means, not shown in FIG. 1. Upon playback, the stored signal is expanded with the result that the original input signal is reproduced with reduced noise.

The adding unit generally includes a differential amplifying means, wherein the signal present on the auxiliary signal path is added to the signal present on the main signal path which is directly applied to the adding means. The auxiliary signal path typically includes a high-pass filter (HPF) having a variable cutoff frequency, and the signal on the auxiliary signal path is applied to the adding mean through a limiter via the HPF.

This conventional system may be alternately implemented in the circuit shown in FIG. 2. This alternate implementation which uses a voltage to current converter in conjunction with a variable current amplifier to achieve similar results is disclosed, for example, in U.S. Pat. No. 4,547,741 to Katakura.

The desired noise reduction effects of the foregoing circuits are, however, lost, at least in part, when such circuits are implemented in a semiconductor. The manufacturing steps required to produce a semiconductor implementation of the circuit often produce resistors, i e., signal dividing or computing elements, having variable performance characteristics. The resulting impedance mismatch between the signal paths adversely affects the signal outputs and causes overall circuit performance to deteriorate.

The circuit disclosed in Korean application No. 91-9841, and shown for example in FIG. 3, solves this problem by including the signal computing elements within the main signal path, and by including a HPF and voltage buffer in the auxiliary path. As shown in FIG. 3, the auxiliary path is formed separate from the main path such that when a signal from the auxiliary path is electrically combined with the signal on the main path an impedance mismatch between the signal paths is not reflected at the differential amplifier of the adding means and, thus, in the compressed signal output.

Referring to FIG. 3, a signal is input at terminal 1 and directed to adder 5 through main signal path 11. An auxiliary signal path 12 is connected to adder 5, and includes a HPF 13, a voltage buffer 15, and limiter 9. The output of this circuit is apparent at terminal 2.

The main and auxiliary signal paths derive signals using resistor means $R_1$ and $R_2$. The resistance of these means should be small to provide sufficient output signal strength. Furthermore, the inherent voltage division which occurs between $R_1$ and $R_2$ makes the calculation of these respective resistances an important lay-out consideration during semiconductor design. In addition, voltage buffer 15 is typically implemented using a differential amplifying means which has an internal resistance. Experience has shown that unaccounted for variations in the foregoing resistances, and in particular, unexpected variations in these resistances caused during semiconductor fabrication processes results in unacceptable circuit performance.

SUMMARY OF THE INVENTION

The present invention solves the foregoing problem and provides an improve noise reduction system having main and auxiliary signal paths.

According to one aspect of the present invention, a signal noise reduction system is provided which includes a main signal path which conducts a first signal, and an auxiliary signal path which conducts a second signal, the system comprising; a high-pass filter in the auxiliary signal path receiving the second signal at an input terminal, a voltage-to-current converter connected to the high-pass filter, an amplifier connected to the voltage-to current converter, and an adder combining the first and second signals to produce an output signal at an output terminal.

BRIEF DESCRIPTION OF THE DRAWINGS

The above objects and other advantages of the present invention will become more apparent by describing a preferred embodiment of the present invention with reference to the attached drawings, in which:

FIGS. 1–3 are schematic block diagrams of conventional noise reduction systems;

FIG. 4 is a schematic block diagram of a signal noise reduction system in accordance with the present invention;

DETAILED DESCRIPTION OF THE PREFERRED EMBODIMENTS

Figure 5:
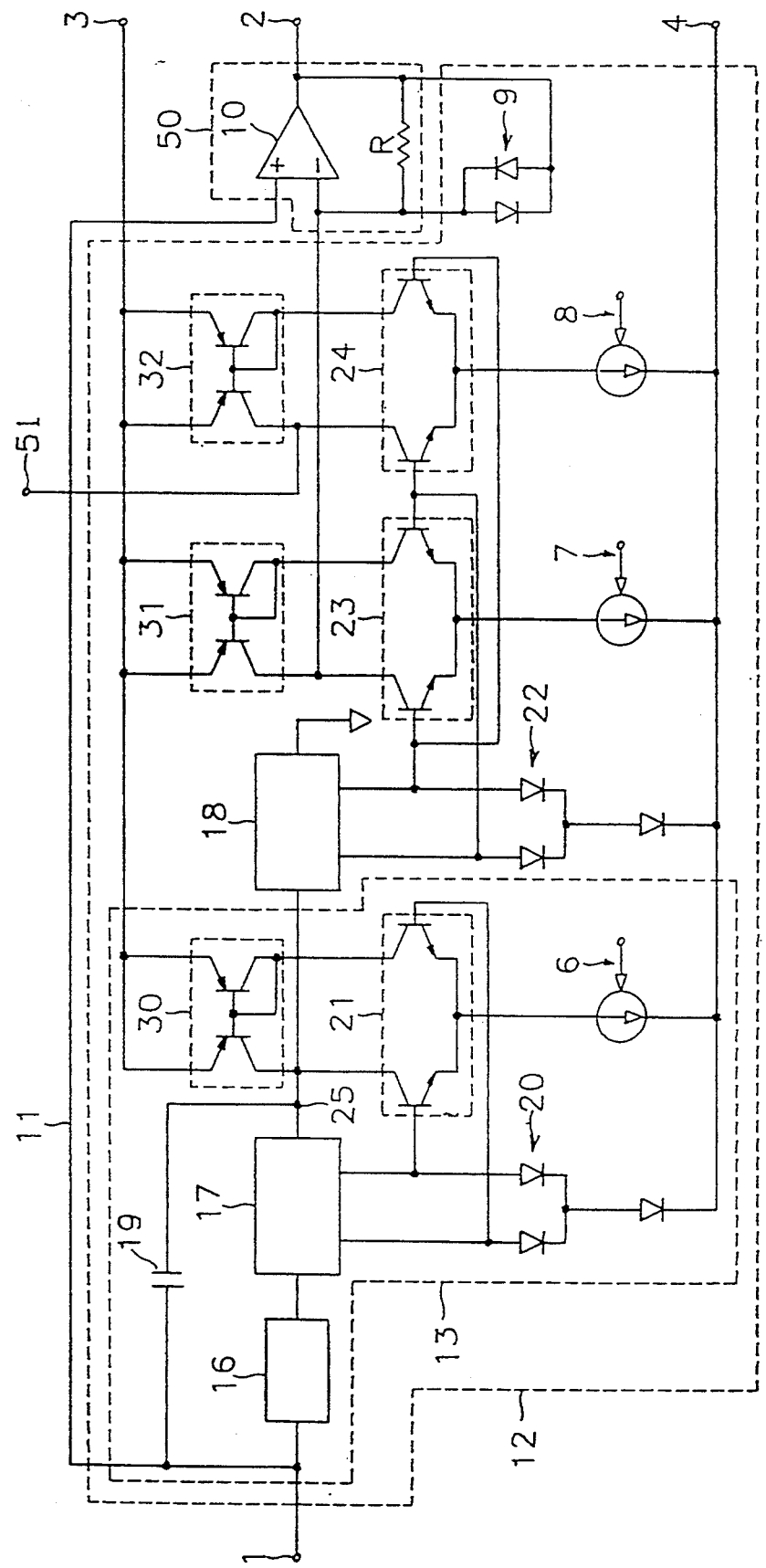
FIG. 5 is a detailed block diagram of a first preferred embodiment of the noise reduction system shown, for example, in FIG. 4.

Turning now to FIG. 4, the present invention generally includes a main signal path 11 and adding means 50 connected between input a terminal 1 and output terminal 2. The present invention also includes auxiliary signal path 12 having first voltage-to-current (hereafter "V-I") converter 17, capacitor 19, variable current amplifying means 40 second V-I converter 41, current amplifier 42, and limiter 9.

Figure 6:
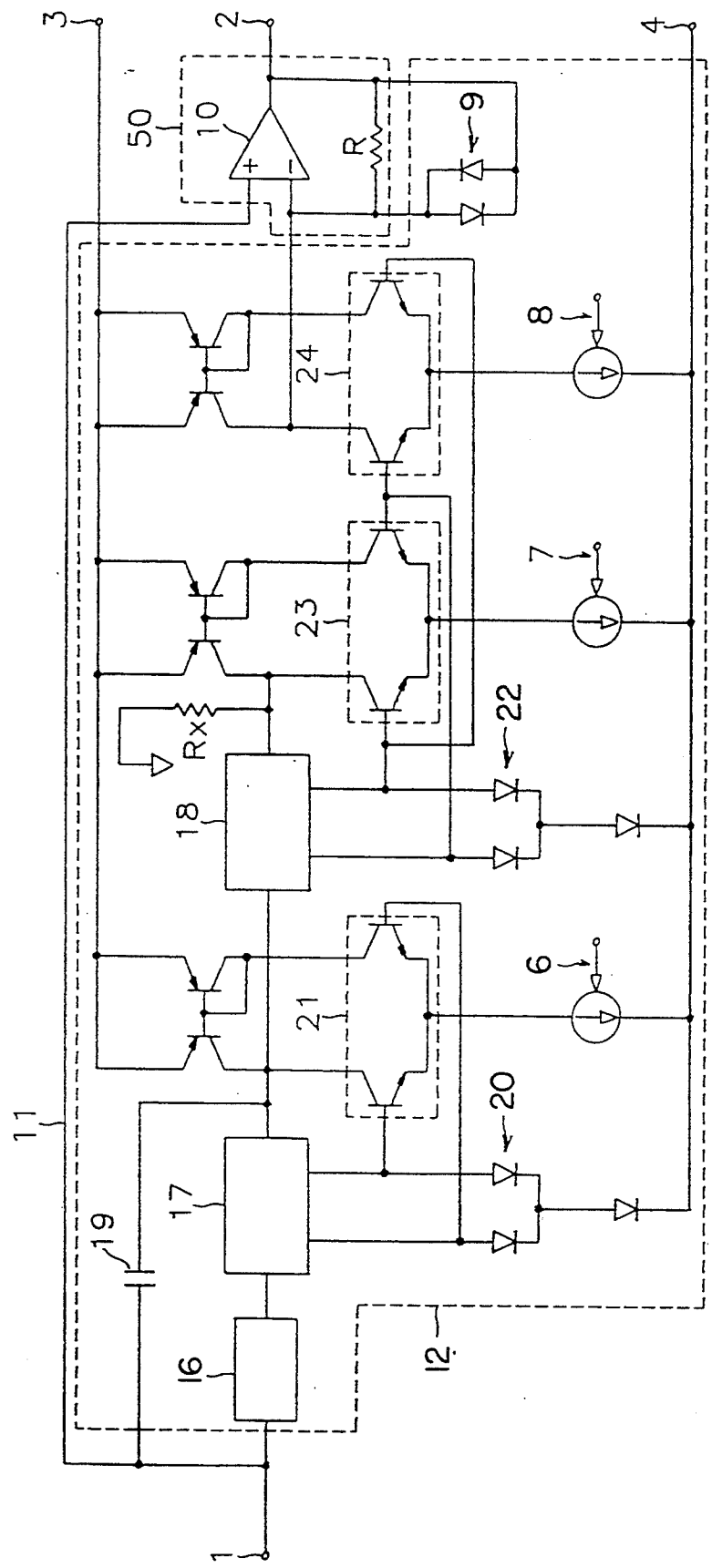
FIG. 6 is a detailed block diagram of a second preferred embodiment of the noise reduction system shown, for example, in FIG. 4.

Preferred embodiments of the present invention are shown in greater detail in FIGS. 5 and 6. Within these two drawings, like numerals represent like elements.

Referring now to FIGS. 5 and 6, a HPF 13 is implemented with the auxiliary signal path 12 and includes first V-I converter 17 and reducer 16 connected in parallel/with capacitor 19, PN junction 20, a first common emitter transistor pair 21, transistor pair 30, and a variable current source 6. As discussed above, the noise reduction system according to the present invention may be characterized in one aspect by the ability to actively vary the cut-off frequency of the HPF. This results in negative feedback, here through node 25, to first common emitter transistor pair 21, variable current source 6, and first V-I converter 17. Transistor pair 30 connected between the collector of first common emitter transistor pair 21 and power terminal 3 forms a current mirror.

The above described HPF 13 has a transfer function T(S) between the input and output which can be expressed as:

$$T(S) = S + a/S + b,$$

where "a" and "b" are circuit constants and S is the input signal strength. It is important to note that the above equation has a zero point and a pole point determined by constants "a" and "b." In cases where "b" is much greater than "a" (i e., "b">>"a"), T(S) can be expressed as:

$$T(S) = S/S + b.$$

Accordingly in such cases, the reduction rate of reducer 16 in the foregoing circuits must be great, a fact which must be considered during layout of the circuits.

In order for adding means 50 to accurately determine (or calculate) the signals on the main and auxiliary signal paths, respectively, without mutual signal path interference, the main signal path should produce a voltage signal and the auxiliary signal path should produce a current signal. Accordingly, since HPF 13 produces a voltage signal, that signal must be converted into a current signal using second V-I converter 18. The converted signal is applied, as shown in FIGS. 5 and 6, to second and third common emitter transistor pairs 23 and 24. These common emitter transistor pairs 23 and 24 act as current amplifying means and produce an output signal via limiter 9 and adding means 50.

The second V-I converter 18 has a transfer function which is related to resistance (R). If this transfer function is defined by the output current in relation to an input voltage and expressed as a transconductance value (gm), then the transfer function, H(S), for the entire signal noise reduction system can be expressed as:

$$\begin{aligned} H(S) &= (1 + T(S)gmR) \\ &= \{1 + gmR[(S + a)/(S + b)]\} \\ &= \{1 + gmR[S/(S + b)] \\ &= [b + S(1 + gmR)]/(S + b). \end{aligned}$$

The foregoing transfer function also has a zero point and a pole point, yet it accomplishes the object of the present invention. Variation of the resistance means as to the change in processing reduces the errors apparent at the differential amplifier by including the resistance means in the V-I converter.

The gain of the auxiliary signal path in a conventional noise reduction circuit such as the one shown in FIG. 1 is fixed and can be defined by some resistance ratio $R_x/R_y$. This ratio affects the computational result obtained at the adding means and can not be changed. However, in the present invention, the gain of the auxiliary signal path is determined by the variable transconductance value of V-I converter 18 in combination with the current amplifying means (transistor pairs 23 and 24 and variable emitter common current sources 7, and 8). Thus, variable compensation is readily provided, and circuit performance is improved accordingly.

Figure 7C:
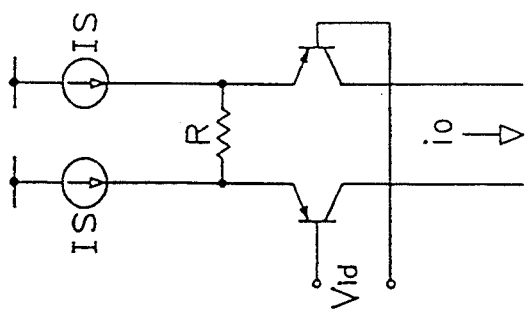
FIGS. 7A, 7B and 7C are detailed block diagrams of the voltage-to-current (V-I) converting means incorporated in the preferred embodiments of the present invention.
Figure 7B:
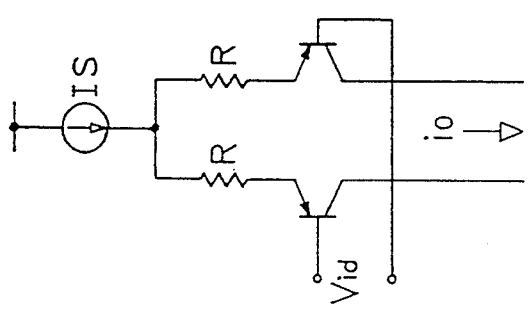
Figure 7A:
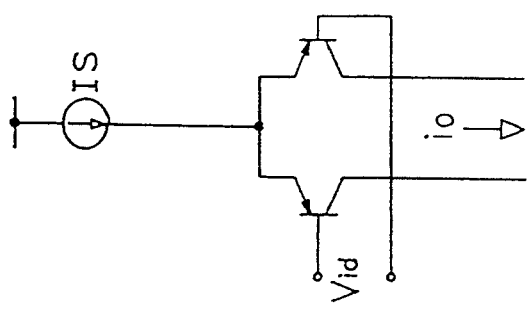

Selected examples of circuits which may be used to implement the second V-I converter 18, are shown in FIGS. 7A, 7B and 7C. Again referring to FIG. 5, the output signal produced by second V-I converter 18 is converted into a corresponding voltage signal at PN junction 22 connected between the output and ground terminal 4. The output signal from second V-I converter 18 is also applied to and current amplified by current amplifiers 23 and 24. The amplified signal is then applied to the inversion input, i.e., the (−) terminal, of the differential amplifier 10 in adding means 50.

Resistance (R) is connected between the output of the differential amplifier 10 and the inversion input, such that the current signal on the auxiliary signal path in finally output as a voltage signal. The voltage signal from the auxiliary signal path is combined (added) to the voltage signal on the main signal path which is applied to the non-inversion, i.e., the (+) terminal, of differential amplifier 10, so as to produce a final output at terminal 2.

In the first preferred embodiment of the present invention shown, for example, in FIG. 5, an emitter resistance at point 51 in the circuit is used to compensate for changes in the value of resistance (R) in the adding means 50. See for example FIGS. 7B and 7C. The second preferred embodiment of the present invention shown, for example, in FIG. 6, is very similar to the first, except that the emitter resistance at point 51 is omitted by use, for example, of the circuit shown in FIG. 7A. Furthermore, the embodiment shown in FIG. 6 includes a resistor $R_x$ connected to the output of second V-I converter 18 and ground. Thus, $R_x$ controls the amount of feedback, and voltage at the input terminal of the current amplifier can be expressed as:

$$V(t) = 1/[1 + R_x \cdot gm]$$

which clearly shows that the voltage is controlled by the selection of the value of $R_x$. In cases where $(R_x \cdot gm) >> 1$, the resistance change may be reduced use of the circuit shown in FIG. 6 is quite practical.

The present invention has been described with respect to several embodiments for purposes of clarity and simplicity. One of ordinary skill in the art will appreciate that variations and/or modifications to concepts explained above will still fall within the scope of the invention as claimed in the appended claims.

What is claimed is:

1. A signal noise reduction system including a main signal path and an auxiliary signal path, the system comprising:
   a high-pass filter in said auxiliary signal path receiving an input signal, and comprising;
      a first voltage-to-current converter receiving said input signal, and producing a first current signal,
      a variable current amplifier receiving and amplifying said first current signal, and
      a capacitor connected across said variable current amplifier and said first voltage-to-current converter, said capacitor defining a cutoff frequency for said high-pass filter;

a second voltage-to-current converter, connected to said high-pass filter and converting a voltage output signal from said high-pass filter into a second current signal;

an amplifier receiving and amplifying said second current signal; and adding means, having a first input receiving said second current signal from said amplifier, and having a second input receiving the input signal from said main signal path, for combining said said second current signal and said input signal to produce an output signal at an output terminal.

2. The signal noise reduction system according to claim 1, wherein said adding means comprises a resistance connected between said first input and said output terminal for converting said second current signal to a corresponding voltage signal.

3. The signal noise reduction system according to claim 2, further comprising a limiter connected between said first input and said output terminal of said adding means.

4. The signal noise reduction system according to claim 1, wherein said variable current amplifier comprises a pair of common emitter transistors, and a current source.

5. The signal noise reduction system according to claim 4, further comprising:

a transistor pair having first and second emitters commonly connected to a power supply voltage and having first and second collectors respectively connected to first and second collectors of said pair of common emitter transistors, wherein said current source is connected between ground and a common emitter terminal of said pair of common emitter transistors.

6. The signal noise reduction system according to claim 1, wherein said amplifier comprises:

a first pair of common emitter transistors having first and second collectors connected to a power supply voltage, and having first and second emitters connected at a first common node;

a first variable current source connected between said first common emitter node and ground;

a second pair of common emitter transistors having third and fourth collectors connected to a power supply voltage, and having third and fourth emitter connected at a second common node; and, a second variable current source connected between said second common emitter node and ground.

7. The signal noise reduction system according to claim 1, wherein said high-pass filter further comprises a signal reduction means connected between an input terminal of said high-pass filter and said first voltage-to-current converter.

8. A signal noise reduction system, comprising: a main signal path receiving an input signal; an auxiliary signal path comprising;

a high-pass filter comprising, a first voltage-to-current converter receiving said input signal and producing a first current signal corresponding to said input signal, a variable current amplifier connected in series with said first voltage-to-current converter, receiving and amplifying said first current signal, and a capacitor connected in parallel across said series connection of said variable current amplifier and said first voltage-to-current converter, said capacitor defining a cutoff frequency for said high-pass filter;

a second voltage-to-current converter converting a voltage output signal from said high-pass filter into a second current signal;

an amplifier receiving and amplifying said second current signal; and, an adder receiving said second current signal at a first input, receiving said input signal from said main signal path, and combining said second current signal and said input signal to produce an outputs signal at an output terminal.

9. The signal noise reduction system according to claim 8 wherein said amplifier comprises:

a first pair of common emitter transistors having first and second collectors connected to a power supply voltage, and having first and second emitters connected at a first common node;

a first variable current source connected between said first common emitter node and ground;

a second pair of common emitter transistors having third and fourth collectors connected to a power supply voltage, and having third and fourth emitters connected at a second common node; and, a second variable current source connected between said second common emitter node and ground.

10. The signal noise reduction system according to claim 8, wherein said adder comprises a resistance connected between said first input and said output terminal for converting said second current signal to a corresponding voltage signal.

11. The signal noise reduction system according to claim 10, further comprising a limiter connected between said first input and said output terminal of said adding means.

12. The signal noise reduction system according to claim 8, wherein said high-pass filter further comprises a signal reduction means connected between an input terminal of said high-pass filter and said first voltage-to-current converter.

13. The signal noise reduction system according to claim 8, wherein said adder comprises a differential amplifier.

* * * * *